(12) United States Patent
Taylor et al.

(10) Patent No.: US 7,687,882 B2
(45) Date of Patent: Mar. 30, 2010

(54) METHODS AND APPARATUS FOR INTEGRATED CIRCUIT HAVING MULTIPLE DIES WITH AT LEAST ONE ON CHIP CAPACITOR

(75) Inventors: William P. Taylor, Amherst, NH (US); Ravi Vig, Bow, NH (US)

(73) Assignee: Allegro Microsystems, Inc., Worcester, MA (US)

(*) Notice: Subject to any disclaimer, the term of this patent is extended or adjusted under 35 U.S.C. 154(b) by 169 days.

(21) Appl. No.: 11/554,619

(22) Filed: Oct. 31, 2006

(65) Prior Publication Data
US 2007/0241423 A1 Oct. 18, 2007

Related U.S. Application Data

(63) Continuation-in-part of application No. 11/279,780, filed on Apr. 14, 2006, now Pat. No. 7,573,112.

(51) Int. Cl.
*H01L 29/00* (2006.01)

(52) U.S. Cl. .................. 257/530; 257/686; 257/676

(58) Field of Classification Search ............... 257/676, 257/686, 296–313, 533, 595–602, 923–924, 257/E27.016, E27.017, E27.019, E27.02, 257/E27.021, E27.023, E27.024, E27.025, 257/E27.031, E27.032, E27.033, E27.034, 257/E27.035, E27.037, E27.038, E27.041, 257/E27.042, E27.043, E27.044, E27.045, 257/E27.047, E27.048, E27.071, E27.09, 257/E27.092, E27.093, E27.095; 438/171, 438/190, 210, 238–253, 329, 379, 387, 444, 438/901; 257/E27.03, E27.101, E27.114, 257/E27.115, E27.116, E21.008, E21.009, 257/E21.01, E21.011, E21.012, E21.013, 257/E21.014, E21.015, E21.016, E21.017, 257/E21.018, E21.019, E21.02, E21.021, 257/E21.364
See application file for complete search history.

(56) References Cited

U.S. PATENT DOCUMENTS

| 4,409,608 | A | * | 10/1983 | Yoder .......................... 257/534 |
| 4,994,731 | A | * | 2/1991 | Sanner ....................... 323/368 |
| 5,244,834 | A | | 9/1993 | Suzuki et al. |
| 5,399,905 | A | | 3/1995 | Honda et al. |
| 5,414,355 | A | | 5/1995 | Davidson et al. |
| 5,563,199 | A | | 10/1996 | Harada et al. |

(Continued)

FOREIGN PATENT DOCUMENTS

| DE | 40 31 560 A1 | 4/1992 |
| JP | 9079865 | 3/1997 |
| WO | WO 01/74139 A2 | 10/2001 |
| WO | WO 01/74139 A3 | 10/2001 |
| WO | WO 2005/013363 A2 | 2/2005 |
| WO | WO 2005/013363 A3 | 2/2005 |

OTHER PUBLICATIONS

Infineon Technologies, Differential Two-Wire Hall Effect Sensor-IC for Wheel Speed Applications with Direction Detection, Feb. 2005, pp. 1-32, vol. 3.1.

(Continued)

*Primary Examiner*—Wai-Sing Louie
*Assistant Examiner*—Sue Tang
(74) *Attorney, Agent, or Firm*—Daly, Crowley, Mofford & Durkee, LLP

(57) ABSTRACT

An integrated circuit comprises a plurality of layers including a first substrate with an on chip capacitor and a second substrate. In one embodiment, the second substrate has an on chip capacitor. The first and/or second substrate can include a sensor element, such as a magnetic sensor element.

14 Claims, 10 Drawing Sheets

U.S. PATENT DOCUMENTS

| | | | |
|---|---|---|---|
| 5,579,194 | A | 11/1996 | MacKenzie et al. |
| 5,581,179 | A | 12/1996 | Engel et al. |
| 5,648,682 | A | 7/1997 | Nakazawa et al. |
| 5,666,004 | A | 9/1997 | Bhattacharyya et al. |
| 5,691,869 | A | 11/1997 | Engel et al. |
| 5,714,405 | A | 2/1998 | Tsubosaki et al. |
| 5,726,577 | A | 3/1998 | Engel et al. |
| 5,729,130 | A | 3/1998 | Moody et al. |
| 5,804,880 | A | 9/1998 | Mathew |
| 5,822,849 | A | 10/1998 | Casali et al. |
| 5,912,556 | A | 6/1999 | Frazee et al. |
| 5,940,256 | A | 8/1999 | MacKenzie et al. |
| 5,973,388 | A | 10/1999 | Chew et al. |
| 6,057,997 | A | 5/2000 | MacKenzie et al. |
| 6,265,865 | B1 | 7/2001 | Engel et al. |
| 6,316,736 | B1 | 11/2001 | Jairazbhoy et al. |
| 6,359,331 | B1 | 3/2002 | Rinehart et al. |
| 6,396,712 | B1 | 5/2002 | Kuijk |
| 6,420,779 | B1 | 7/2002 | Sharma et al. |
| 6,429,652 | B1 | 8/2002 | Allen et al. |
| 6,486,535 | B2 | 11/2002 | Liu |
| 6,501,270 | B1 | 12/2002 | Opie |
| 6,504,366 | B2 | 1/2003 | Bodin et al. |
| 6,563,199 | B2 | 5/2003 | Yasunaga et al. |
| 6,608,375 | B2 | 8/2003 | Terui et al. |
| 6,610,923 | B1 | 8/2003 | Nagashima et al. |
| 6,642,609 | B1 | 11/2003 | Minamio et al. |
| 6,696,952 | B2 | 2/2004 | Zirbes |
| 6,713,836 | B2 | 3/2004 | Liu et al. |
| 6,737,298 | B2 | 5/2004 | Shim et al. |
| 6,747,300 | B2 | 6/2004 | Nadd et al. |
| 6,775,140 | B2 | 8/2004 | Shim et al. |
| 6,781,359 | B2 | 8/2004 | Stauth et al. |
| 6,798,057 | B2 * | 9/2004 | Bolkin et al. ............... 257/686 |
| 6,809,416 | B1 | 10/2004 | Sharma |
| 6,812,687 | B1 | 11/2004 | Ohtsuka |
| 6,825,067 | B2 | 11/2004 | Ararao et al. |
| 6,832,420 | B2 | 12/2004 | Liu |
| 6,853,178 | B2 | 2/2005 | Hayat-Dawoodi |
| 6,861,283 | B2 | 3/2005 | Sharma |
| 6,875,634 | B2 | 4/2005 | Shim et al. |
| 6,921,955 | B2 | 7/2005 | Goto |
| 6,960,493 | B2 | 11/2005 | Ararao et al. |
| 6,974,909 | B2 | 12/2005 | Tanaka et al. |
| 6,995,315 | B2 | 2/2006 | Sharma et al. |
| 7,005,325 | B2 | 2/2006 | Chow et al. |
| 7,026,808 | B2 | 4/2006 | Vig et al. |
| 7,075,287 | B1 | 7/2006 | Mangtani et al. |
| 7,166,807 | B2 | 1/2007 | Gagnon et al. |
| 7,259,624 | B2 | 8/2007 | Barnett |
| 7,265,531 | B2 | 9/2007 | Stauth et al. |
| 7,304,370 | B2 | 12/2007 | Imaizumi et al. |
| 7,358,724 | B2 | 4/2008 | Taylor et al. |
| 7,378,721 | B2 | 5/2008 | Frazee et al. |
| 7,476,816 | B2 | 1/2009 | Doogue et al. |
| 7,476,953 | B2 | 1/2009 | Taylor et al. |
| 2002/0027488 | A1 | 3/2002 | Hayat-Dawoodi et al. |
| 2002/0195693 | A1 | 12/2002 | Liu et al. |
| 2003/0209784 | A1 | 11/2003 | Schmitz et al. |
| 2004/0094826 | A1 | 5/2004 | Yang et al. |
| 2004/0135220 | A1 * | 7/2004 | Goto ......................... 257/427 |
| 2004/0135574 | A1 | 7/2004 | Hagio |
| 2004/0207035 | A1 * | 10/2004 | Witcraft et al. ............. 257/427 |
| 2004/0207077 | A1 | 10/2004 | Leal et al. |
| 2004/0207400 | A1 | 10/2004 | Witcraft et al. |
| 2004/0262718 | A1 | 12/2004 | Ramakrishna |
| 2005/0035448 | A1 | 2/2005 | Hsu et al. |
| 2005/0040814 | A1 | 2/2005 | Vig et al. |
| 2005/0151448 | A1 | 7/2005 | Hikida et al. |
| 2005/0173783 | A1 | 8/2005 | Chow et al. |
| 2005/0224248 | A1 | 10/2005 | Gagnon et al. |
| 2005/0248005 | A1 | 11/2005 | Hayat-Dawoodi |
| 2005/0253507 | A1 | 11/2005 | Fujimura et al. |
| 2005/0270748 | A1 | 12/2005 | Hsu |
| 2005/0274982 | A1 | 12/2005 | Ueda et al. |
| 2006/0077598 | A1 | 4/2006 | Taylor et al. |
| 2006/0219436 | A1 | 10/2006 | Taylor et al. |
| 2006/0267135 | A1 | 11/2006 | Wolfgang et al. |
| 2007/0007631 | A1 | 1/2007 | Knittl |
| 2007/0018642 | A1 | 1/2007 | Ao |
| 2007/0138651 | A1 | 6/2007 | Hauenstein |
| 2007/0170533 | A1 | 7/2007 | Doogue et al. |

OTHER PUBLICATIONS

Infineon Technologies, Smart Hall Effect Sensor for Camshaft Applications, 2003, pp. 1-2.

Allegro Microsystems, Inc., Dynamic Self-Calibrating Peak-Detecting Differential Hall Effect Gear Tooth Sensor, pp. 1-14, Worcester, Massachusetts.

Allegro Microsystems, Inc., Hall-Effect IC Applications Guide, pp. 1-34.

Allegro Microsystems, Inc., Dynamic Self-Calibrating Peak-Detecting Differential Hall Effect Gear Tooth Sensor, Mar. 22, 2006, pp. 1-2.

Allegro Microsystems, Inc., Two-Wire True Zero-Speed Miniature Differential Peak-Detecting Sensor with Continuous Calibration, pp. 1-13.

Allegro Microsystems, Inc., Two-Wire True Zero-Speed Miniature Differential Peak-Detecting Sensor with Continuous Calibration, Mar. 22, 2006, pp. 1-2.

Gagnon; "Current Sensor" U.S. Appl. No. 11/144,970, filed Jun. 3, 2005.

Mangtani; "Current Sensor" U.S. Appl. No. 11/336,602, filed Nov. 10, 2006.

Doogue; "Current Sensor" U.S. Appl. No. 11/401,160, filed on Apr. 10, 2006.

Taylor; "Current Sensor" U.S. Appl. No. 11/383,021, filed May 12, 2006.

Taylor; "Integrated Sensor Having A Magnetic Flux Concentrator" U.S. Appl. No. 11/051,124, filed Feb. 4, 2005.

Taylor; "Resistor Having A Predetermined Temperature Coefficient" U.S. Appl. No. 10/962,889, filed Oct. 12, 2004.

Doogue; "Arrangements for an Integrated Sensor" U.S. Appl. No. 11/335,944, filed Jan. 20, 2006.

Taylor; "Integrated Magnetic Flux Concentrator" U.S. Appl. No. 11/129,933, filed May 16, 2005.

Mario Motz, Dieter Draxelmayr, Tobias Werth & Bernhard Forster, A Chopped Hall Sensor With Small Jitter and Programmable "True Power-On" Function, IEEE Journal of Solid-State Circuits, vol. 40, No. 7 Jul. 2005 pp. 1533-1540.

Second and Supplementary Notice Information the Applicant of the Communication of the International Application (To Designated Office Which Apply the 30 Month Time Limit Under Article 22(1) dated Aug. 14, 2008 (Form PCT/IB/308). (PCT/US2007/008920).

Notification Concerning Transmittal of Copy of International Preliminary Report on Patentability (Chapter I of the Patent Cooperation Treaty) dated Oct. 23, 2008 (PCT/US2007/008920).

File downloaded from PAIR for U.S. Appl. No. 11/279,780, filed Apr. 14, 2006, file through Apr. 7, 2009, 1013 Pages.

File downloaded from PAIR for U.S. Appl. No. 11/877,144, filed Oct. 23, 2007, file through Apr. 7, 2009, 108 Pages.

File downloaded from PAIR for U.S. Appl. No. 11/877,100, filed Oct. 23, 2007, file through Apr. 7, 2009, 120 Pages.

Notification Concerning Transmittal of Copy of International Preliminary Report on Patentability (Chapter 1 of the Patent Cooperation Treaty), International Preliminary Report on Patentability, Written Opinion of the International Searching Authority, PCT/US2007/013358, dated Jan. 22, 2009, 8 pages.

Notification of transmittal of the International Search Report and the Written Opinion of the International Searching Authority or the Declaration, PCT/US2007/013358, dated Feb. 28, 2008, 13 pages.

Seyed Hassan Hashemi: "The Close Attached Capacitor: A Solution To Switching Noise Problems", IEEE Transactions On Components, Hybrids, and Manufacturing Technology, IEEE Inc. New York, US, vol. 15, No. 6, Dec. 1, 1992, pp. 1056-1063, XP000364765. ISSN: 0148-6411.

File downloaded from PAIR for U.S. Appl. No. 11/457,626, filed Jul. 14, 2006, file through Sep. 2, 2009, 286 pages.

File downloaded from PAIR for U.S. Appl. No. 11/279,780, filed Apr. 14, 2006, file through Sep. 4, 2009.

File downloaded from PAIR for U.S. Appl. No. 11/877,144, filed Oct. 23, 2007, file through Sep. 4, 2009.

File downloaded from PAIR for U.S. Appl. No. 11/877,100, filed Oct. 23, 2007, file through Sep. 4, 2009.

Notification of transmittal of the International Search Report and the Written Opinion of the International Searching Authority, or the Declaration dated Oct. 23, 2007 (Form PCT/ISA/220). International Search Report (Form PCT/ISA/210). Written Opinion of the International Searching Authority (Form PCT/ISA/237).

* cited by examiner

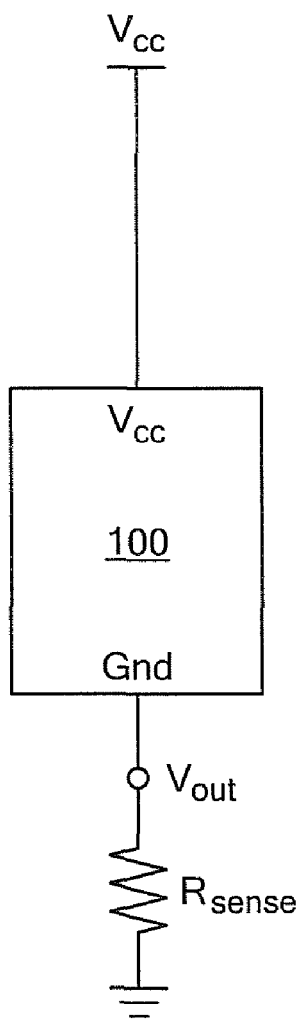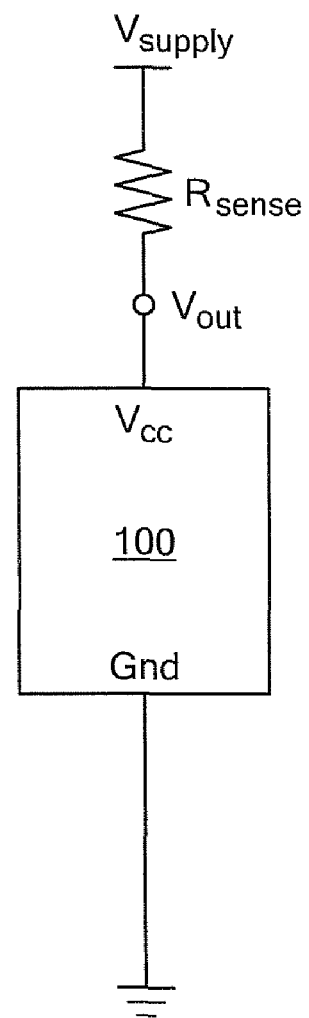
*FIG. 2A*  *FIG. 2B*

METHODS AND APPARATUS FOR INTEGRATED CIRCUIT HAVING MULTIPLE DIES WITH AT LEAST ONE ON CHIP CAPACITOR

CROSS-REFERENCE TO RELATED APPLICATIONS

The present application is a continuation-in-part application of U.S. patent application Ser. No. 11/279,780, filed on Apr. 14, 2006, now U.S. Pat. No. 7,573,112 which is incorporated herein by reference.

BACKGROUND

As is known in the art, there are a variety of sensors that are useful for particular applications. For example, magnetic sensors are useful to detect movement, such as rotation, of an object of interest. Typically, Hall-effect sensors require a discrete decoupling capacitor component placed on or near the sensor to enhance EMC (Electromagnetic Compatibility) and reduce so-called long-wire noise problems. However, external capacitors incur added cost and processing at the individual device level. External capacitors also increase the total package size if the capacitor resides on the leadframe or requires an additional printed circuit board.

SUMMARY

The present invention provides a magnetic sensor including an on chip capacitor formed from first and second conductive layers and a dielectric layer disposed over a substrate. With this arrangement, the need for an external decoupling capacitor may be eliminated. While the invention is primarily shown and described in conjunction with particular layer stack ups, devices and configurations, it is understood that the invention is applicable to circuits in general in which it is desirable to provide a capacitive impedance.

In one aspect of the invention, a magnetic sensor comprises a plurality of layers including a substrate including circuitry, at least one conductive layer to interconnect the circuitry, and an insulator layer to electrically insulate the at least one conductive layer. First and second conductive layers are disposed above the substrate, and a dielectric layer is disposed between the first and second conductive layers such that the first and second conductive layers and the dielectric layer form a capacitor. The sensor further includes a first terminal electrically connected to the first conductive layer and a second terminal electrically connected to the second conductive layer.

In another aspect of the invention, a method includes forming a first conductive layer over a substrate containing circuitry, forming a dielectric layer over the first conductive layer, and, forming a second conductive layer over the dielectric layer such that the first conductive layer, the dielectric layer, and the second conductive layer form a first capacitor. A first terminal can be coupled to the first conductive layer and a second terminal can be coupled to the second conductive layer.

In a further aspect of the invention, an integrated circuit device comprises a first substrate including circuitry, at least one conductive layer to interconnect the circuitry, an insulator layer to electrically insulate the at least one conductive layer, first and second conductive layers generally parallel to the substrate, a first dielectric layer disposed between the first and second conductive layers such that the first and second conductive layers and the first dielectric layer form a first on chip capacitor, and a second substrate in communication with the first substrate.

In another aspect of the invention, a method comprises forming a first conductive layer on a first substrate containing circuitry, forming a first dielectric layer on the first conductive layer, forming a second conductive layer on the first dielectric layer such that the first conductive layer, the first dielectric layer, and the second conductive layer form a first on chip capacitor, providing first and second terminals, wherein the first terminal is coupled to the first conductive layer and the second terminal is coupled to the second conductive layer, and coupling a second substrate to the first substrate.

BRIEF DESCRIPTION OF THE DRAWINGS

The foregoing features of this invention, as well as the invention itself, may be more fully understood from the following description of the drawings in which:

FIGS. 2A and 2B show a two-wire magnetic sensor having an on chip capacitor;

DETAILED DESCRIPTION

Figure 1A:
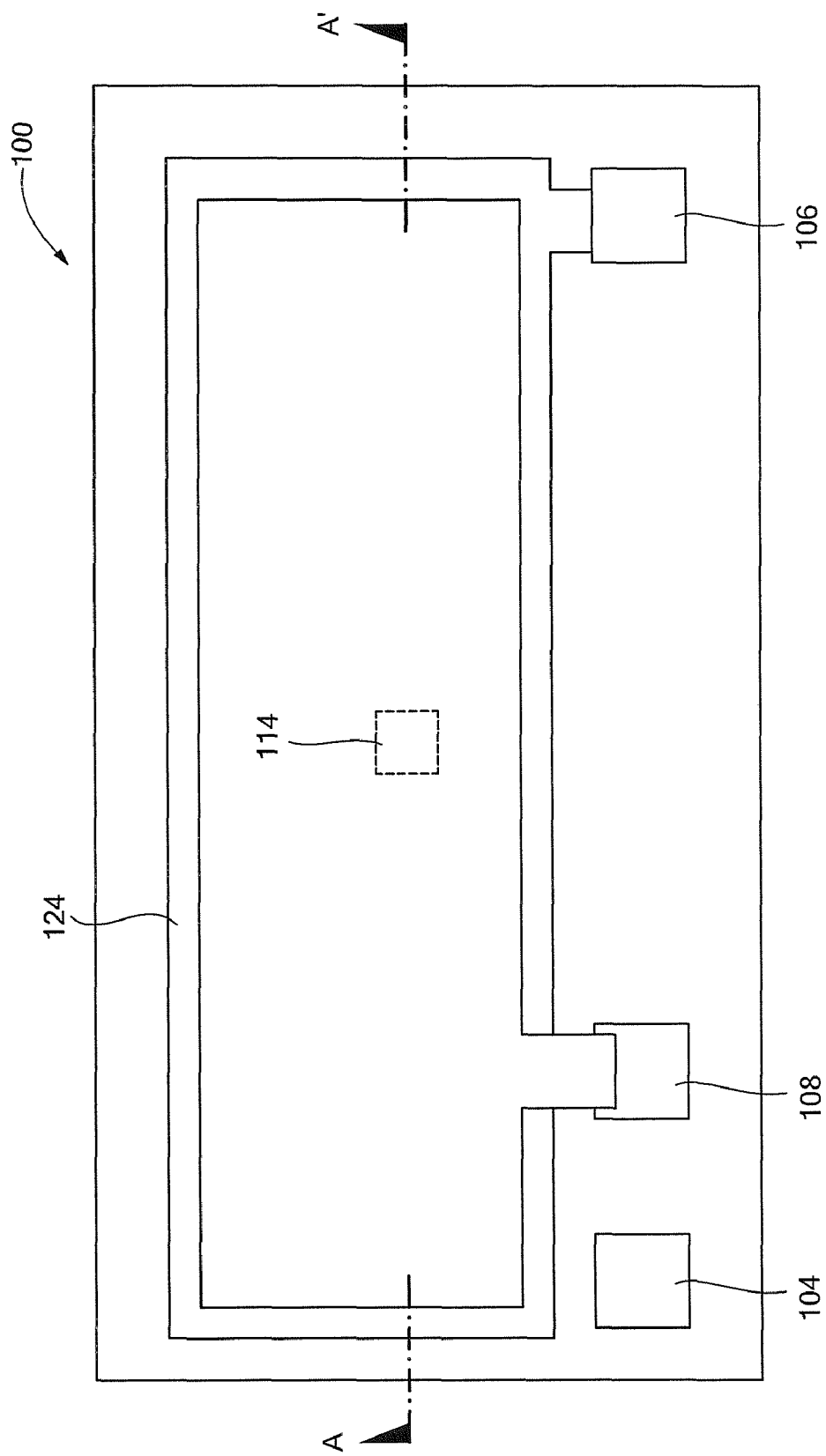
FIG. 1A is a top view of a sensor having an on chip capacitor in accordance with an exemplary embodiment of the invention.
Figure 1B:
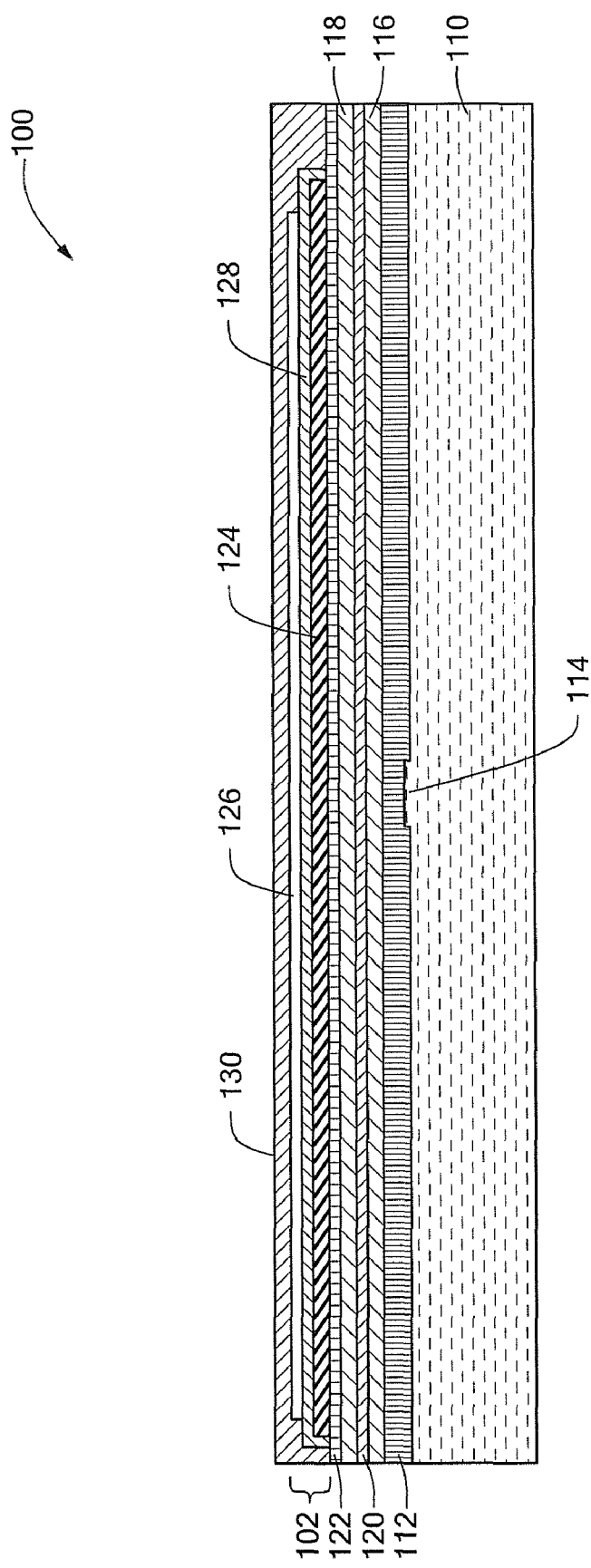
FIG. 1B is a cross-sectional view of the sensor of FIG. 1A taken along line A-A.

FIGS. 1A-B show an exemplary embodiment of a magnetic sensor 100 embodiment having an on chip capacitor 102 in accordance with the present invention. In the illustrated embodiment, the sensor 100 is a two-wire Hall effect type sensor having a VCC terminal 104 and a ground terminal 106. The capacitor 102 can be provided as a decoupling capacitor coupled between the VCC terminal 104 and the ground terminal 106, for example. As described more fully below, the capacitor 102 can be coupled to a VCC cap terminal 108, which is at the same potential as the VCC terminal 104 in an exemplary embodiment. The VCC cap terminal 108 and the VCC terminal 104 can be electrically coupled using any suitable technique, such as wire bonding. This arrangement allows breakdown testing. In alternative embodiments, VCC and VCC cap bond pads could be combined to form a single pad.

A first metal layer 116 is disposed on the substrate 110 and an optional second layer 118, which is sandwiched between first and second insulating layers 120, 122, is disposed over the first metal layer 116. The first and second metal layers 116, 118 provide, for example, interconnection and routing for the device layer 112. The first and second insulating layers 120, 122 can be provided, for example, as interlayer dielectric and/or passivation layers.

First and second conductive layers 124, 126 are separated by a dielectric material 128 to form the on chip capacitor 102 above the substrate. The capacitor 102 is covered by a further insulating layer 130. In an exemplary embodiment, the capacitor 102 is separated, and electrically isolated, from the second metal layer 118 by the second insulating layer 122.

In an exemplary embodiment, a substrate 110, e.g., silicon, includes an integrated circuit (IC) in layers 112, 116, 120, 118, and/or 122 in which circuitry is formed in a manner well known to one of ordinary skill in the art. The device layer 112 can include a Hall element 114 that forms part of the magnetic sensor 100. The device layer may include various layers necessary to form an integrated circuit, including, but not limited to, implant or doped layers, polysilicon, epi layers, oxide, or nitride layers.

While a particular layer stack up is shown and described, it is understood that other embodiments having different layering orders and greater and fewer metal and other layers are within the scope of the invention. In addition, additional conductive layers can be added to form additional capacitors to meet the needs of a particular application.

As shown in FIG. 2A, for the illustrated two-wire sensor, a sense resistor Rsense can be coupled between the ground terminal 106 and a ground connection, or as shown in FIG. 2B, the sense resistor Rsense can be coupled between the VCC terminal 104 and the power supply. This enables measurement of the sensor 100 output in the form of current changes in response to a positional displacement of a magnetic object of interest. By providing an on chip capacitor, the need for an external decoupling capacitor for the sensor may be eliminated.

Figure 3:
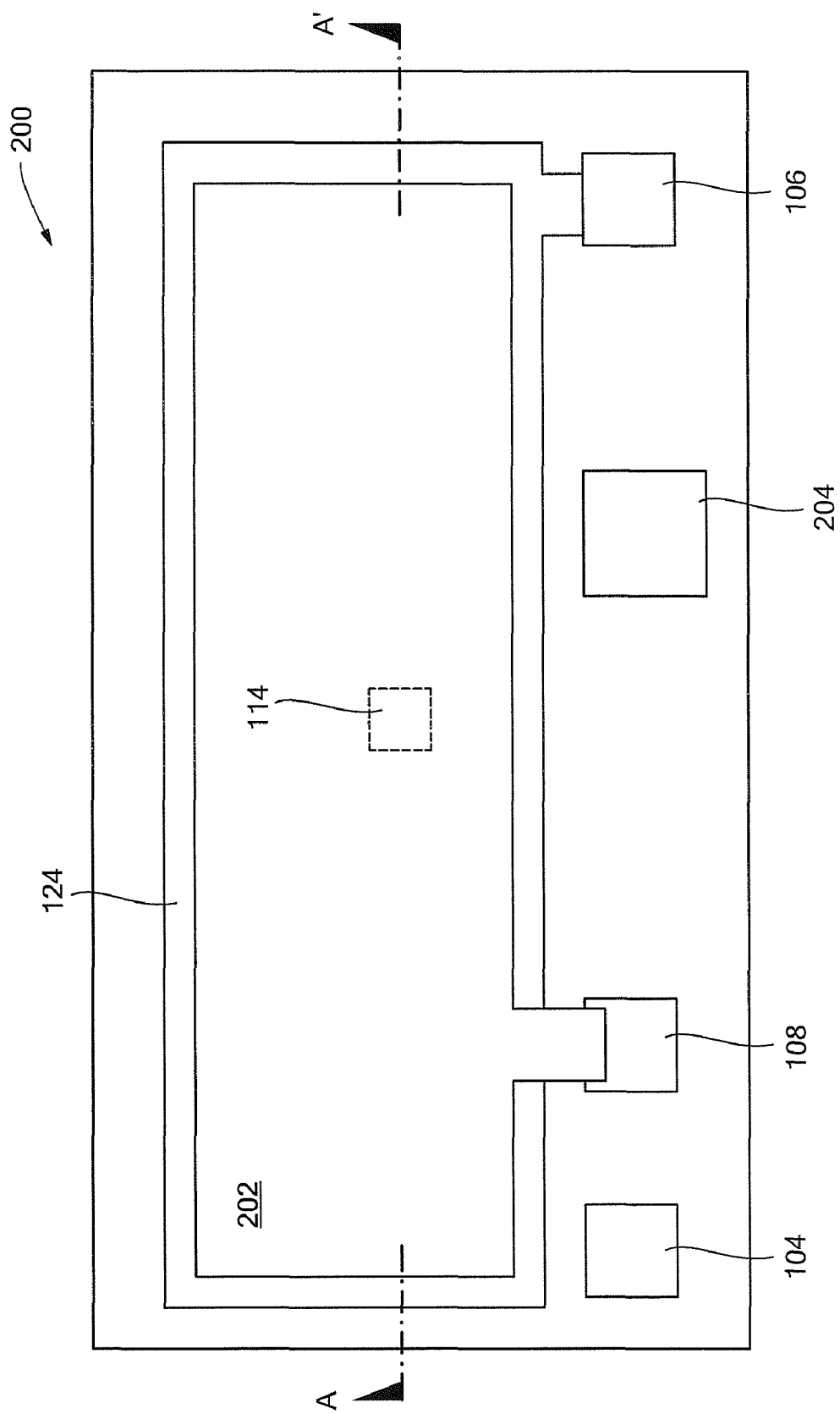
FIG. 3 is a pictorial top view of a three-wire magnetic sensor having an on chip capacitor.

In another embodiment shown in FIG. 3, a three-wire magnetic sensor 200 includes an on chip capacitor 202 with a Vout terminal 204 to provide a sensor output signal. The sensor 200 of FIG. 3 has some similarity with the sensor 100 of FIGS. 1A-1C, where like reference numbers indicate like elements.

It is understood that higher breakdown voltage requirements for the capacitor may limit the amount of capacitance that can be provided by the on chip capacitor. Lower breakdown voltage requirements may increase the amount of capacitance that can be provided. Factors that determine the characteristics of the on chip capacitor 102 include, for example, die size, metal layer area, conductive layer area, dielectric material, selected breakdown voltage, layer spacing, geometry, and others.

A variety of dielectric materials for the capacitor 102 can be used including, but not limited to; silicon nitride, Tantalum oxide, Aluminum oxide, ceramics, glass, mica, polyesters (eg. Mylar), KAPTON, polyimides (e.g. Pyralin by HD Microsystems), benzocyclobutene (BCB, e.g. Cyclotene by Dow Chemical), and polynorbornene (e.g., Avatrel by Promerus). Inorganic dielectrics may be preferable for some applications based on their higher dielectric constant and the ability to create uniform thin films in the sub-micron range; e.g. 3,000 to 5,000 Angstroms in thickness.

These same dielectrics may be used where appropriate for interlayer dielectric, or final passivation materials. In the case of the interlayer dielectric, it may be advantageous to select a material that planarizes well, and has a low dielectric constant for use between the second metal layer 118 and the conductive layer 124. This should reduce any unwanted coupling of signals from lines on the metal layer 118 to the conductive layer 124, which may, for example, be a ground plane.

A variety of suitable materials can be used to provide the device layer for the sensor including silicon, gallium arsenide, silicon on insulator (SOI), and the like. In addition, various materials can be used to provide the metal layers and the conductive layers, which form the capacitor. Exemplary metal and conductive layer materials include copper, aluminum, alloys and/or other suitable metals.

In general, for a die size of about 2.5 to 3 mm$^2$, the on chip capacitor provides in the order of 400 pF. For a larger die, e.g., about 5 mm$^2$, the capacitor provides in the order of 800 pF. In exemplary embodiments, the capacitor provides a capacitance from about 100 pF to about 1,500 pF for a substrate ranging in size from about 1 mm$^2$ to about 10 mm$^2$.

In one particular embodiment, the first and second conductive layers 124, 126 (FIG. 1B) have dimensions of 2.3 mm$^2$. The dielectric material is silicon nitride having a thickness ranging of approximately 3,000 Å to about 5,000 Å. This arrangement provides a breakdown voltage of about at least 50V with a capacitance of about 300 pF to about 500 pF.

A Hall sensor having an on chip capacitor of about 100 pF to about 1,500 pF and at least 50V breakdown voltage is well suited for many vehicle applications, such as anti-lock brake sensors (ABS), linear position sensors, angle sensors, transmission sensors, cam sensors, and crank sensors.

In general, the first and second conductive layers 124, 126 (FIG. 1B) forming the capacitor 102 cover from about thirty percent to about ninety percent of the die area. The capacitor 102 may be above the die where above refers to some degree of overlap between generally parallel planes formed by the die and the conductive layers of the capacitor.

In one embodiment, the first and second layers cover an area of about eighty percent of the die area. Such a capacitor would provide a capacitance on the order of 400 pF, which can provide additional EMC protection to the circuitry on the die. In some devices, in the order of 200 pF may be sufficient for EMC or long-wire protection. In such a case the area required by the capacitor is not as large, and may be on the order of fifty percent of the total die area. In general, the capacitor can be sized to meet the needs of a particular application.

As used herein, the term die refers to a substrate, which may be a semiconductor or a semiconductor layer on an insulator, for example SOI substrates, with its associated circuits or electronic device elements. The circuits on the die may include semiconductor devices, for example diodes, and transistors, and passive devices, for example a resistor, inductor, or capacitor.

Figure 4:
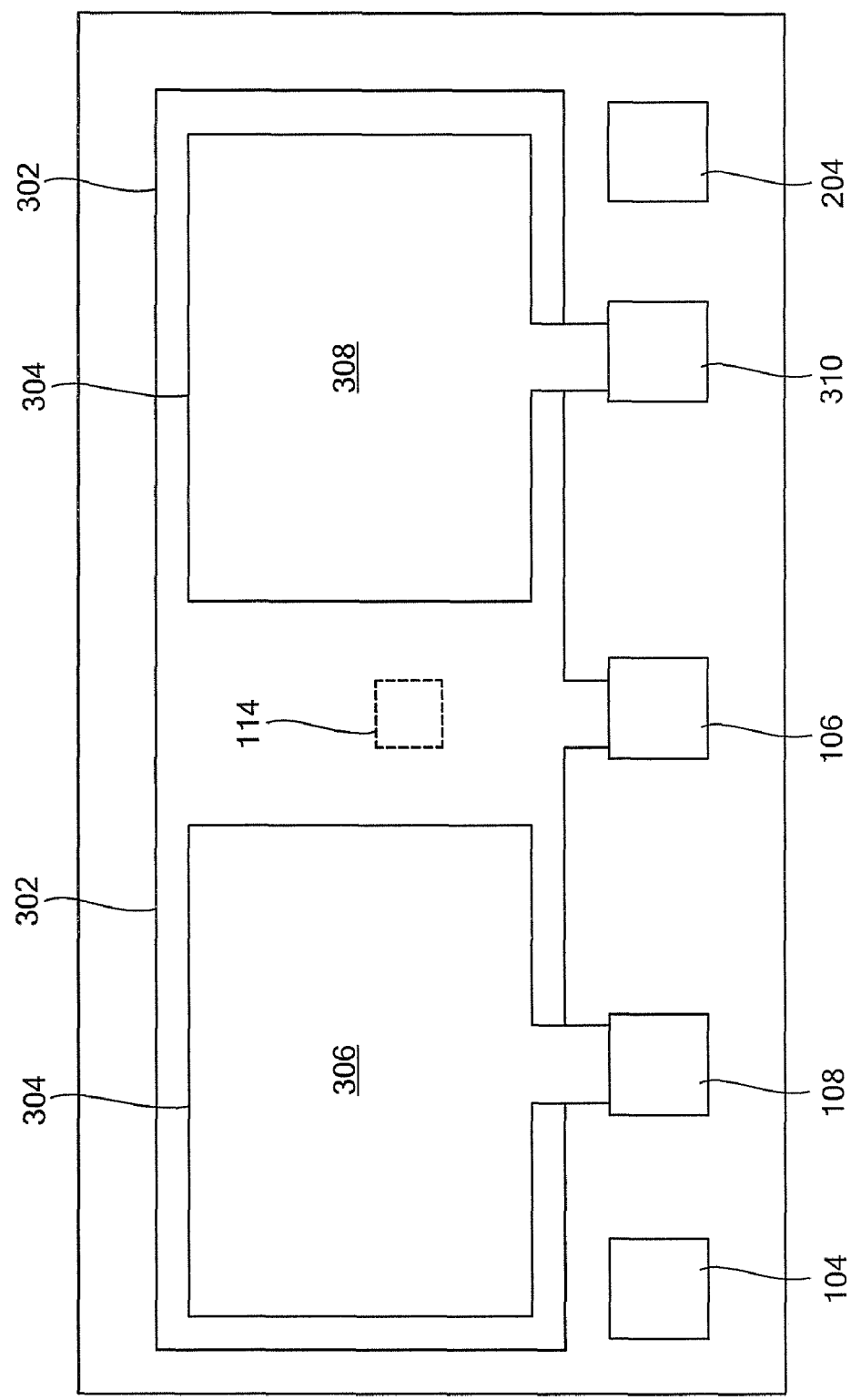
FIG. 4 is a schematic diagram of a sensor having multiple on chip capacitors.

As shown in FIG. 4, the second conductive layer 304 can be separated to form multiple capacitors, shown as first and second capacitors 306, 308 provided the first conductive layer 302 is at the same potential for both. It would also be apparent that the first conductive layer 302 could also be split to form separate capacitors, although it may require the addition of a bonding pad depending on the application. The first capacitor 306 provides a decoupling capacitor between the VCC cap terminal 108 and ground 106. The second capacitor 308 is coupled between a Vout cap terminal 310 and ground 106. A Vout terminal 204, which can be coupled to the Vout cap terminal 310 via wire-bond, provides a sensor output signal for a three-wire magnetic sensor, for example.

It is understood that the apportionment of the first and second conductive layers 302, 304 can be made to achieve capacitance requirements for a particular application. In addition, the first and second conductive layers can be split to form any practical number of capacitors above the die. Such multiple capacitor configurations may be useful for applications that require more than two-wires; for example a three-wire part with power, ground, and independent output pins.

Figure 5:
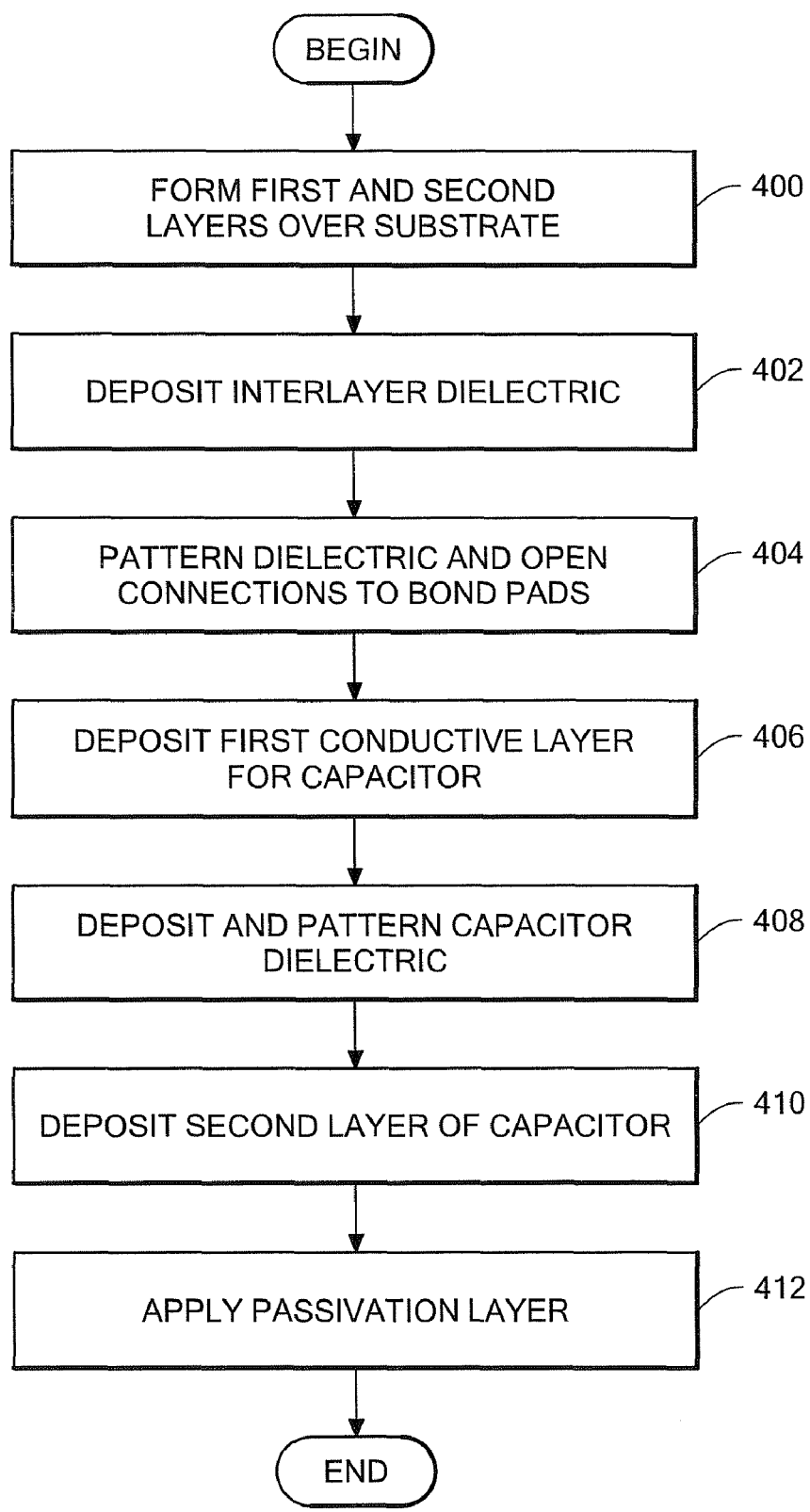
FIG. 5 is a flow diagram showing an exemplary sequence of steps to fabricate a sensor having an on chip capacitor.

FIG. 5 shows an exemplary sequence of steps to fabricate a sensor having an on-chip capacitor. In general, fabrication of the integrated capacitor is performed after an integrated circuit process is performed, which may also be referred to as the base process.

In step 400, first and second metal layers are formed over a substrate. In one particular embodiment, the base process includes two metal layers for interconnection and routing and a final passivation. It may be desirable to change the final passivation on the base process, which may typically include an oxide and nitride layer. After the second metal layer, in step 402 an interlayer dielectric is deposited. Again, this is the place where the final passivation would be performed in the base process. The interlayer dielectric can be an oxide, nitride, or organic dielectric such as a polyimide, or BCB. A material such as BCB has advantages in that it planarizes the underlying substrate well and allows a flat surface for the subsequent capacitor deposition. In step 404, the interlayer dielectric is then patterned to open connections to the bond pads in the underlying integrated circuit.

In step 406, a conductive layer is then deposited on the wafer and patterned to form one of the capacitor electrodes. In the illustrated embodiment, the lower capacitor electrode is connected to the ground bonding pad, but not any other portions of the underlying circuit. In some cases it may be desirable to have the lower capacitor layer on the other bonding pads of the integrated circuit, although these pads are not connected to the capacitor electrode. In step 408, the capacitor dielectric is deposited and patterned. The dielectric material may be silicon nitride, or other suitable material. In step 410, the second conductive layer of the capacitor is deposited on the wafer and patterned to form the top electrode of the capacitor. The upper layer of the capacitor may be connected to the Vcc pad of the integrated circuit, or it may be its own bonding pad. Having the upper layer of the capacitor as an independent pad allows the dielectric breakdown to be tested during the final test of the integrated circuit with an on-chip capacitor. In step 412, a final passivation layer is applied to the integrated circuit with the capacitor and pattern openings for the bonding pads.

Figure 6A:
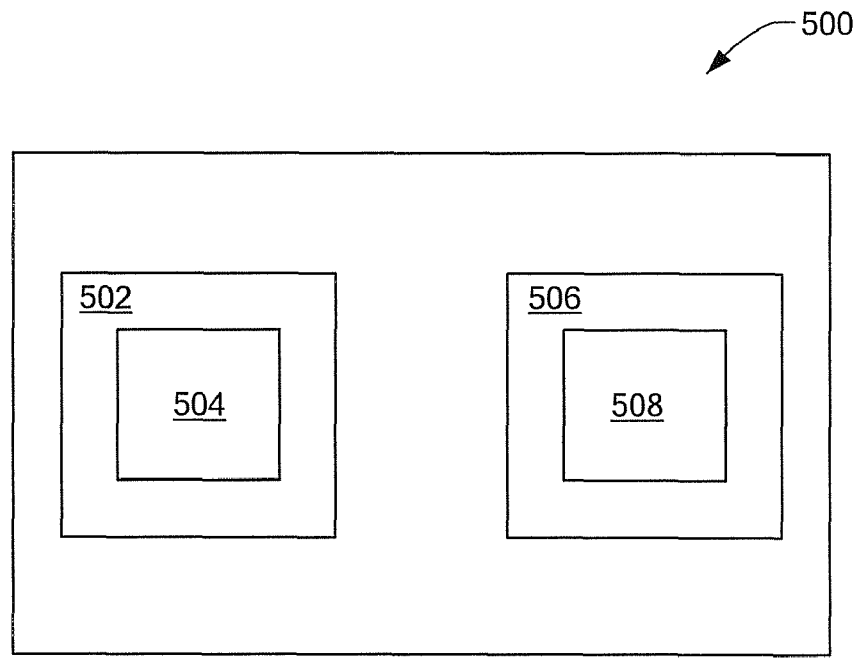
FIG. 6A is a schematic depiction of an integrated circuit having multiple chips having at least one respective on-chip capacitor in accordance with exemplary embodiments of the invention.
Figure 6B:
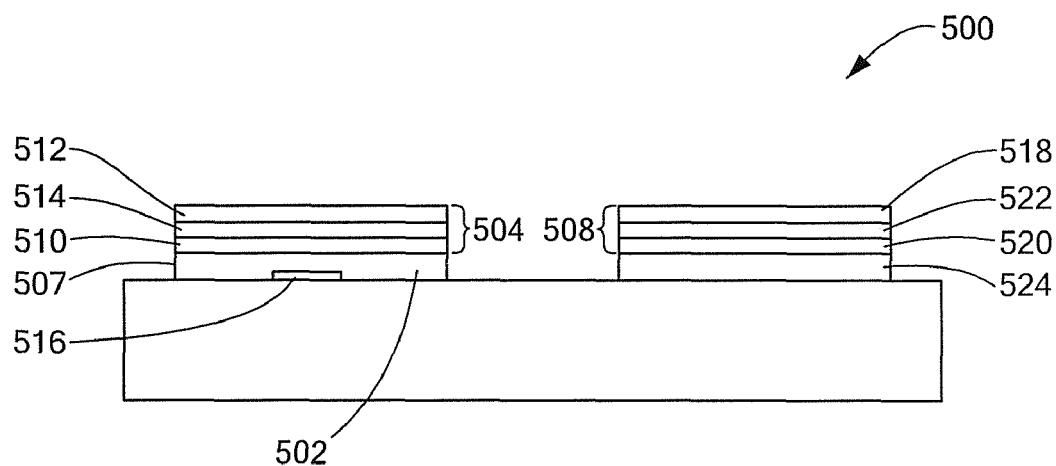
FIG. 6B is a side view of the integrated circuit of FIG. 6A.

FIGS. 6A and 6B shows an exemplary integrated circuit 500 having a first die 502 having a first on-chip capacitor 504 and a second die 506 having a second on-chip capacitor 508. The first capacitor 504, which can be disposed above a device layer 507, can include first and second conductive layers 510, 512 with a dielectric material 514 therebetween. An optional sensor element 516 can be formed in the first die 502.

The second capacitor 508 can similarly include third and fourth conductive layers 518, 520 and an insulative layer 522. The third conductive layers 518 can be disposed over a device layer 524 for the second die 506.

The first and second capacitors 504, 508 can be covered by respective optional insulating layers (not shown).

Figure 6C:
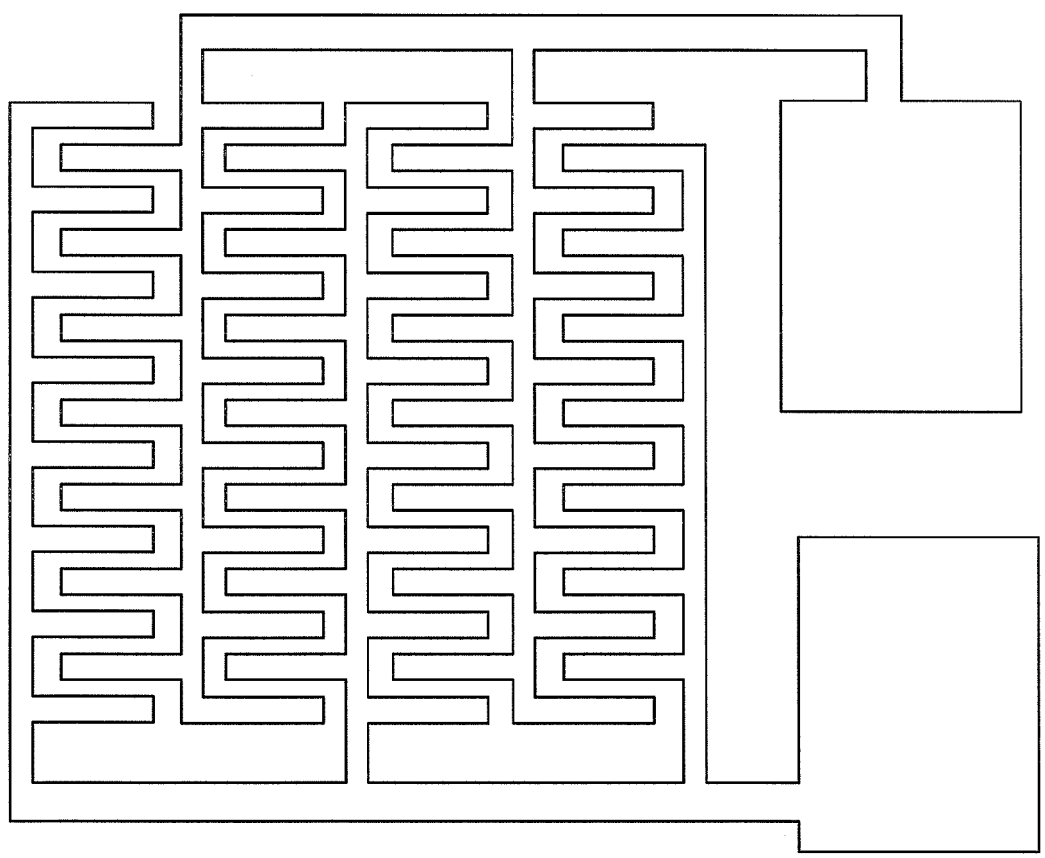
FIG. 6C is a pictorial representation of interdigitated on-chip capacitors.

While the first and second on chip capacitors are shown above the respective substrates, it is understood that in other embodiments, one or more of the on chip capacitors is below the respective substrate. In general, the conductive layers forming the on chip capacitors are generally parallel to the respective substrate. It is understood that the geometry of the capacitors can vary. For example, in another embodiment shown in FIG. 6C, one conductive layer, or multiple conductive layers, can be processed to form an on-chip interdigitated capacitor. In one embodiment, a single conductive layer is patterned to form an on-chip interdigitated capacitor. In another embodiment, multiple conductive layers can be patterned to form one or more on-chip interdigitated capacitors. It is understood that the properties of the dielectric material used to form the capacitors factors into the impedance of the capacitor.

It is understood that in other embodiments the first die 502 can have multiple on-chip capacitors. That is, the first and second metal layers 510, 512 can be divided, such as by etching, to form two on-chip capacitors for the first die. Similarly, the third and fourth conductive layers can be divided to provide multiple on-chip capacitors for the second die. In addition, one or both of the dies can have on-chip capacitors. Further, embodiments are contemplated with more than two dies with at least one of the dies having an on-chip capacitor. Other embodiments are contemplated having a variety of applications having a variety of configurations. For example, sensors, such as magnetic sensor elements, can be provided in one die, both dies, and/or multiple dies. Integrated circuits having on-chip capacitors can be provided as a wide variety of circuit types including sensors, system on a chip, processors, and the like.

In one embodiment, the first and second dies 502, 506 are formed from the same material, such as silicon. In other embodiments, the first and second dies are formed from different materials. Exemplary materials include Si, GaAs, InP, InSb, InGaAsP, SiGe, ceramic and glass.

Figure 7:
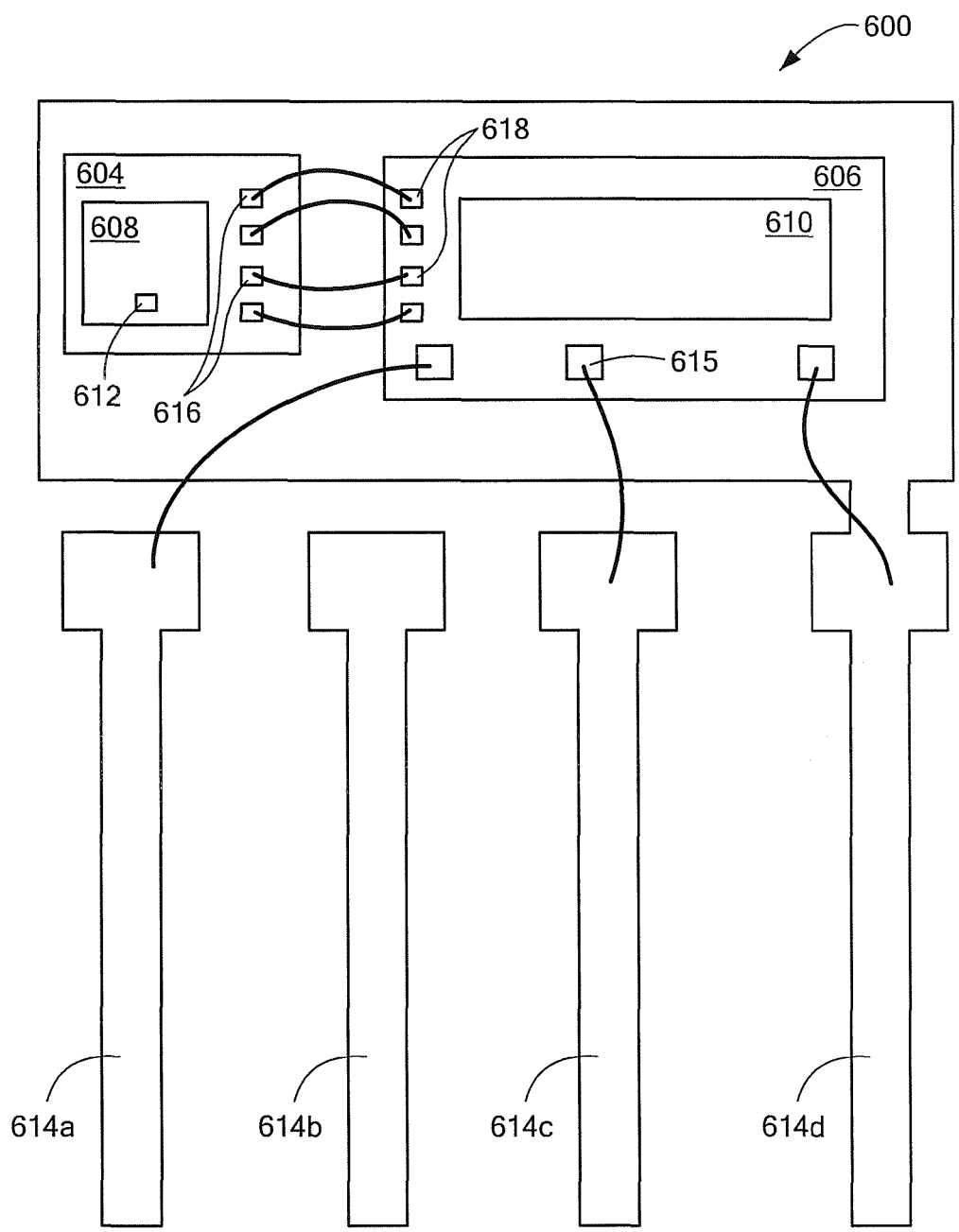
FIG. 7 is a pictorial representation of an integrated circuit having a first substrate with a first on-chip capacitor and a second substrate with a second on-chip capacitor in accordance with exemplary embodiments of the invention.

FIG. 7 shows an exemplary integrated circuit 600 having first and second dies 604, 606, each having respective on-chip capacitors 608, 610. The first die 604 includes a sensor element 612. In one particular embodiment, the sensor element is a Hall element. The second die 606 includes circuitry to support the sensor element 612 and provide output information, such as position output information for the sensor.

The integrated circuit 600 includes lead fingers 614a-d to provide input/output connections for the sensor. As described above, connections, such as wire bonds, can be made between the leadfingers 614 and input/output pads 615 on the second die 606. Connections/pads can be provided for ground, VCC, and/or signals. While not shown, it is understood that pads can also be provided for connections between the first die 604 and the lead fingers.

In addition, respective first and second die pads 616, 618 enable electrical connections between the first and second dies 604, 606. It is understood that any practical number of die pads can be provided for desired connections between the dies.

It is understood that the inventive multi-die embodiments can have a variety of configurations, such as flip chip embodiments.

Figure 8A:
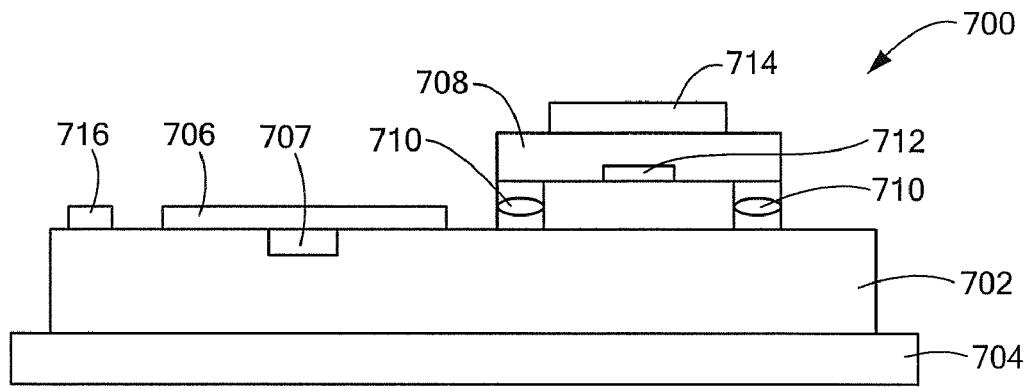
FIG. 8A is a side view of a multi-chip, multi on chip capacitor integrated circuit in a flip chip configuration in accordance with exemplary embodiments of the invention.
Figure 8B:
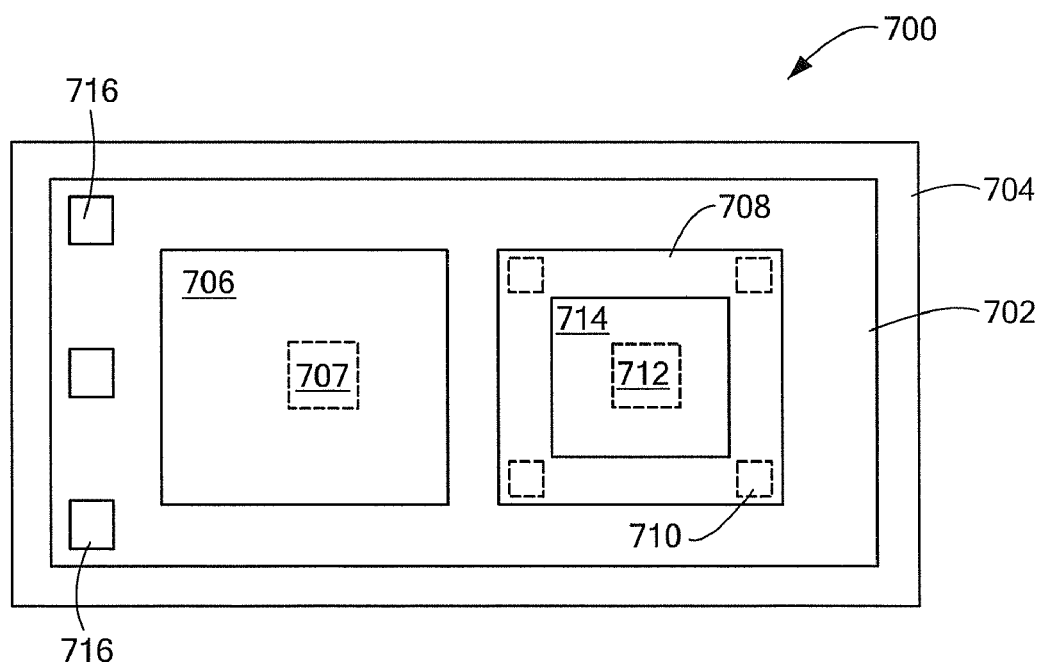
FIG. 8B is a top view of the integrated circuit of FIG. 8A.

For example, FIGS. 8A and 8B show a flip-chip configuration having multiple dies with on-chip capacitors. An integrated circuit 700 includes a first die or substrate 702 disposed on a leadframe 704. A first on-chip capacitor 706 is formed over a portion of the first die 702. An optional sensor element 707 can be formed in the first die.

A second substrate or die 708 is coupled on top of the first die 702, such as by solder balls 710. The second die 708 can include a sensor element 712. A second on chip capacitor 714 is disposed on the second die 708.

Bonding wires can couple bonding pads 716 to lead fingers (not shown) on the lead frame.

As noted above, the first and second dies 702, 708 can be provided as the same material or different materials. Exemplary materials include Si, GaAs, InP, InSb, InGaAsP, SiGe, ceramic and glass. Further, sensing elements in the first and second dies can be the same type of device or different types of devices. Exemplary sensor elements include Hall effect, magnetoresistance, giant magnetoresistance (GMR), anisotropic magnetoresistance (AMR), and tunneling magnetoresistance (TMR). The respective on chip capacitors 706, 714 can be sized to achieve a desired impedance, as discussed above.

While the invention is primarily shown and described in conjunction with integrated circuit sensors, and particularly magnetic sensors, it is understood that the invention is applicable to integrated circuits in general for which it is desirable to provide a capacitor. In addition, while the on-chip capacitors are shown above a die it is understood that embodiments are contemplated in which the on chip capacitor is below the die. That is, the conductive layers forming the on-chip capacitor are generally parallel with the plane in which the die rests. In one embodiment, interdigitated electrodes could also be used to form on-chip capacitors in a single layer of metal.

It is understood that a variety of suitable fabrication processes can be used to form a sensor having an on chip capacitor including, but not limited to, bipolar, DMOS, bi-CMOS, CMOS, and processes and combinations of these and other processes.

While exemplary embodiments contained herein discuss the use of a Hall effect sensor, it would be apparent to one of ordinary skill in the art that other types of magnetic field sensors may also be used in place of or in combination with a Hall element. For example the device could use an anisotropic magnetoresistance (AMR) sensor and/or a Giant Magnetoresistance (GMR) sensor. In the case of GMR sensors, the GMR element is intended to cover the range of sensors comprised of multiple material stacks, for example: linear spin valves, a tunneling magnetoresistance (TMR), or a colossal magnetoresistance (CMR) sensor. In other embodiments, the sensor includes a back bias magnet.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A magnetic sensor, comprising:
   a substrate including circuitry coupled to a voltage supply terminal;
   at least one conductive layer to interconnect the circuitry;
   an insulator layer to electrically insulate the at least one conductive layer;
   first and second conductive layers generally parallel to the substrate;
   a dielectric layer disposed between the first and second conductive layers such that the first and second conductive layers and the dielectric layer form a capacitor; and
   first and second terminals, wherein the first terminal is electrically connected to the first conductive layer and the voltage supply terminal, and the second terminal is electrically connected to the second conductive layer,
   wherein the capacitor provides a capacitance from about 100 pF to about 1,500 pF for a substrate ranging in size from about 1 mm$^2$ to about 10 mm$^2$.

2. The sensor according to claim 1, wherein the capacitor overlaps with at least thirty percent of an area of the substrate.

3. The sensor according to claim 1, wherein the first and second layers are divided to form a further capacitor.

4. The sensor according to claim 1, wherein the sensor includes a Hall sensor.

5. The sensor according to claim 4, wherein the Hall sensor is a two-wire Hall sensor.

6. The sensor according to claim 1, wherein the second terminal is coupled to a ground terminal.

7. The sensor according to claim 1, wherein the substrate is a first substrate and further comprising:
   a second substrate in communication with the first substrate, comprising:
      a third conductive layer;
      a fourth conductive layer; and
      a second dielectric layer disposed between the third and fourth conductive layers such that the third and fourth conductive layers and the second dielectric layer form a second on-chip capacitor for the second substrate.

8. The magnetic sensor of claim 1, further including a back bias magnet as part of the magnetic sensor.

9. The magnetic sensor of claim 1, wherein the magnetic sensor includes an AMR sensor.

10. The magnetic sensor of claim 1, wherein the magnetic sensor includes a GMR sensor.

11. A magnetic sensor, comprising:
    a substrate including circuitry coupled to a voltage supply terminal;
    at least one conductive layer to interconnect the circuitry;
    an insulator layer to electrically insulate the at least one conductive layer;
    a first conductive layer generally parallel to the substrate comprising:
       a first portion comprising:
          a plurality of first protrusions extending in a first direction and disposed along a length of the first portion; and
       a second portion comprising:
          a plurality of second protrusions extending in a second direction parallel and opposite to the first direction and disposed along a length of the second portion;
    a second conductive layer generally parallel to the substrate comprising:
       a third portion comprising:
          a plurality of third protrusions extending in the second direction and disposed along a length of the third portion, at least one of the third protrusions intervening between a pair of the first protrusions of the first conductive layer; and
          a plurality of fourth protrusions extending in the first direction and disposed along the length of the third portion, at least one of the fourth protrusions intervening between a pair of the second protrusions of the first conductive layer;
    a dielectric layer disposed between the first and second conductive layers such that the first and second conductive layers and the dielectric layer form a capacitor; and
    first and second terminals, wherein the first terminal is electrically connected to the first conductive layer and the voltage supply terminal, and the second terminal is electrically connected to the second conductive layer.

12. The magnetic sensor of claim 11, further including a back bias magnet as part of the magnetic sensor.

13. The magnetic sensor of claim 11, wherein the magnetic sensor includes an AMR sensor.

14. The magnetic sensor of claim 11, wherein the magnetic sensor includes a GMR sensor.

* * * * *

UNITED STATES PATENT AND TRADEMARK OFFICE
CERTIFICATE OF CORRECTION

| | | |
|---|---|---|
| PATENT NO. | : 7,687,882 B2 | Page 1 of 1 |
| APPLICATION NO. | : 11/554619 | |
| DATED | : March 30, 2010 | |
| INVENTOR(S) | : Taylor | |

It is certified that error appears in the above-identified patent and that said Letters Patent is hereby corrected as shown below:

Col. 2, line 30, delete "; and" and replace with -- ; --.

Col. 2, line 32, delete "capacitor." and replace with -- capacitor; --.

Col. 5, line 46, delete "shows" and replace with -- show --.

Col. 5, line 55, delete "layers" and replace with -- layer --.

Col. 6, line 39, delete "leadfingers" and replace with -- lead fingers --.

Signed and Sealed this
First Day of February, 2011

David J. Kappos
*Director of the United States Patent and Trademark Office*